(12) United States Patent
An (10) Patent No.: US 11,165,221 B2
(45) Date of Patent: Nov. 2, 2021

(54) OPTICAL DEVICE BASED ON SERIES PUSH-PULL OPERATION

(71) Applicant: Electronics and Telecommunications Research Institute, Daejeon (KR)

(72) Inventor: Shinmo An, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 169 days.

(21) Appl. No.: 16/532,281

(22) Filed: Aug. 5, 2019

(65) Prior Publication Data
US 2020/0194964 A1    Jun. 18, 2020

(30) Foreign Application Priority Data
Dec. 17, 2018 (KR) .......... 10-2018-0163619

(51) Int. Cl.
| | |
|---|---|
| *H01S 5/026* | (2006.01) |
| *G02F 1/225* | (2006.01) |
| *G02F 1/01* | (2006.01) |
| *H01S 5/062* | (2006.01) |
| *G02F 1/017* | (2006.01) |
| *H01S 5/22* | (2006.01) |
| *H01S 5/042* | (2006.01) |

(Continued)

(52) U.S. Cl.
CPC .......... *H01S 5/0265* (2013.01); *G02F 1/0102* (2013.01); *G02F 1/01708* (2013.01); *G02F 1/2257* (2013.01); *H01S 5/0427* (2013.01); *H01S 5/06213* (2013.01); *H01S 5/101* (2013.01); *H01S 5/22* (2013.01); *G02F 1/0155* (2021.01); *G02F 1/01766* (2021.01); *G02F 2203/20* (2013.01)

(58) Field of Classification Search
CPC .......... H01S 5/0265; H01S 5/101; H01S 5/22; H01S 5/0427; G02F 1/2257; G02F 1/0102; G02F 1/01708; G02F 1/0155; G02F 1/01766
See application file for complete search history.

(56) References Cited

U.S. PATENT DOCUMENTS

| | | |
|---|---|---|
| 5,731,889 A | 3/1998 | Jeong et al. |
| 6,778,309 B2 | 8/2004 | Freund et al. |

(Continued)

FOREIGN PATENT DOCUMENTS

KR    1020120037458 A    4/2012

OTHER PUBLICATIONS

C. Caillaud, et al., "Low cost 112 GB/s InP DFB-EAM for PAM-4 2 km Transmission", Ecoc 2015-ID: 1011, Proceeding from Conference on Sep. 27- Oct. 1, 2015, pp. 1-3.

(Continued)

*Primary Examiner* — Yuanda Zhang
(74) *Attorney, Agent, or Firm* — Rabin & Berdo, P.C.

(57) ABSTRACT

Provided is an optical device including a radio frequency (RF) signal source configured to electrically provide an RF signal, a first diode configured to operate as a laser diode (LD) or an electro-absorption modulator (EAM) in response to the RF signal, a second diode configured to share an N region of the first diode, be serially connected to the first diode, and have a P region connected to a ground to operate as a capacitor for series push-pull operation with the first diode, and a resistor connected between the N region and the ground.

13 Claims, 6 Drawing Sheets

(51) Int. Cl.
 *H01S 5/10* (2021.01)
 *G02F 1/015* (2006.01)

(56) References Cited

U.S. PATENT DOCUMENTS

| | | | |
|---|---|---|---|
| 8,520,984 | B2 | 8/2013 | Webster et al. |
| 8,805,134 | B1* | 8/2014 | Raring .................. G02B 6/126 385/14 |
| 9,477,013 | B2 | 10/2016 | Lee et al. |
| 2005/0232319 | A1* | 10/2005 | Mason .................... H01S 5/042 372/38.02 |
| 2007/0127534 | A1* | 6/2007 | Shimamura ........... H01S 5/0265 372/50.1 |
| 2007/0237193 | A1 | 10/2007 | Finzi et al. |
| 2013/0016745 | A1* | 1/2013 | Moto .................... H01S 5/0428 372/29.011 |
| 2016/0248223 | A1* | 8/2016 | Blauvelt ............... H01S 5/5027 |

OTHER PUBLICATIONS

David R Stauffer, et al., "Comparison of PAM-4 and NRZ Signaling", Mar. 10, 2004, IBM, pp. 1-27.
Robert G. Walker, "High-speed III-V Semiconductor Intensity Modulators", IEEE Journal of Quantum Electronics, vol. 27, No. 3, Mar. 1991, pp. 654-667.
Yanyang Zhou, et al., "Modeling and optimization of a single drive push-pull silicon Mach-Zehnder modulator", Photon. Res., vol. 4, No. 4, Aug. 2016, pp. 153-161.

* cited by examiner

OPTICAL DEVICE BASED ON SERIES PUSH-PULL OPERATION

CROSS-REFERENCE TO RELATED APPLICATIONS

This U.S. non-provisional patent application claims priority under 35 U.S.C. § 119 of Korean Patent Application No. 10-2018-0163619, filed on Dec. 17, 2018, the entire contents of which are hereby incorporated by reference.

BACKGROUND

The present disclosure here relates to an optical device, and more particularly to a laser diode (LD) or an electro-absorption modulator (EAM) based on a series push-pull operation.

In the current optical communication technology, a long distance and high bit rate communication uses an electron modulator based on a Mach-Zehnder interferometer (MZI). On the other hand, in a relatively short distance and lower bit rate communication system, a directly modulated laser (DML) or an externally modulated laser (EML) is mainly used. However, according to a request for increasing the bit rate, a high bit rate is increasingly requested even in a short distance optical communication device, and accordingly, high-performance optical devices for short distance are actively being developed.

An MZI modulator performs optical modulation with an interference phenomenon caused by phase modulation of light according to an application of a voltage. The MZI modulator may increase the bit rate with a coherent communication in which the bit rate is increased by subdividing the phase modulation as well as the intensity of light. However, since the DML or EML for short distance basically uses only the intensity of light, there is a limitation on a material of an optical device directly related to the optical modulation or in the electrical characteristics of a diode to be driven. In order to address such a limitation, nowadays, a bit rate is increased by introducing auxiliary techniques rather than improving the structure itself of an optical device. For example, a four-level pulse amplitude modulation (PAM4) technology is used for increasing the bit rate. In the existing Non-Return-to-Zero NRZ) manner, the intensity of an optical signal has been transmitted in a binary bit signal (1, 0) having two levels (on-off). On the contrary, in the PAM4 technology, the intensity of an optical signal is transmitted using a two-bit binary bit signal (00, 01, 10, and 11) having 4 levels. Accordingly, in the PAM4 manner, the bit rate of a transmission signal may be doubled.

In this way, for an identical optical device, when a signal transmission manner is changed from the NRZ to the PAM4, the bit rate is doubled. However, it is required to encode/decode two electrical signals into one PAM4 signal. In addition, the PAM4 manner is disadvantageous in that a signal-to-noise ratio (SNR) is reduced and a jitter noise is increased, etc.

SUMMARY

The present disclosure provides a technology having a series push-pull structure based on a single electrode so as to increase bit rate performance of a laser diode or an electro-absorption (or electro-optical absorption) modulator based on a compound semiconductor.

The present disclosure also provides an optical device having a diode structure of a series push-pull structure in which a chirp is reduced.

An embodiment of the inventive concept provides an optical device including: a radio frequency (RF) signal source configured to electrically provide an RF signal; a first diode configured to operate as a laser diode (LD) or an electro-absorption modulator (EAM) in response to the RF signal; a second diode configured to share an N region of the first diode, be serially connected to the first diode, and have a P region connected to a ground to operate as a capacitor for series push-pull operation with the first diode; and a resistor connected between the N region and the ground.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the present disclosure will be described in detail with reference to the accompanying drawings so that the present disclosure can be easily realized by those skilled in the art.

Figure 1:
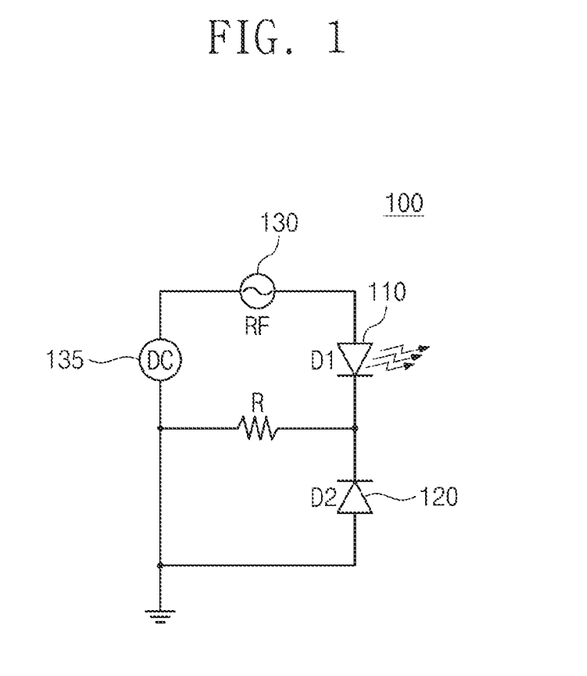
FIG. 1 is a circuit diagram schematically showing an optical device including a series-push-pull diode according to an embodiment of the inventive concept.

FIG. 1 is a circuit diagram schematically showing an optical device including a series-push-pull diode according to an embodiment of the inventive concept. In relation to FIG. 1, the optical device 100 according to an embodiment of the inventive concept may include two diodes 110 and 120, a radio frequency (RF) signal source 130, a DC bias 135, and a resistor R. Here, the optical device 100 may be used as a laser diode (hereinafter, LD) or an electro-absorption modulator (hereinafter, EAM).

A first diode D1 or 110 is provided with a PIN diode substantially used as the LD or EAM. In the inventive concept, a second diode D2 or 120 connected to the first diode 110 may be added. The first diode 110 and the second diode 120 may be PIN diodes having the same structure. An N region of the first diode 110 and an N region of the second diode 120 may be electrically connected to each other. Structurally, the first diode 110 and the second diode 120 may include a common N region.

The resistor R is connected between the ground and the N region of the first diode 110 or the N region of the second diode 120. A P region of the first diode 110 is connected to the RF signal source 130 for inputting an RF electrical signal. The DC bias 135, which is serially connected to the RF signal source 130, may be connected to the P region of the first diode 110. In addition, the P region of the second diode 120 may be connected to the ground.

When the optical device 100 operates as the LD and an electrical signal of an RF is input to the P region of the first diode 110, the first diode 110 oscillates by a current input by the RF signal source 130, and light is generated. On the other hand, when the optical device 100 operates as the EAM, an absorption coefficient of the first laser diode 110 may be adjusted by the RF signal source 130. As a result, the intensity of light externally input to the first diode 110 may be modulated, and the intensity-modulated light is output.

By means of the resistor R connected to the N region of the first diode 110, an RF electrical signal input from the RF signal source 130 may operate the second diode 120 without passing through the resistor at a specific frequency or higher. In this case, two diodes 110 and 120 are driven by one RF electrical signal, and thus respective voltages over the diodes 110 and 120 may be reduced by half. In addition, according to a series connection of the diodes 110 and 120, capacitance thereof may be reduced by half. For one RF electrical signal, the diodes 110 and 120 operate in anti-phase. Since the diodes 110 and 120 are connected in series, the voltages over the respective diodes 110 and 120, and the capacitance will be reduced by half. Consequently, the frequency bandwidth of the RF electrical signal, which may be provided by the RF signal source 130, may be doubled.

Here, the resistor R may be provided with a part of an RLC circuit (not shown) provided between the ground and the common N region of the diodes 110 and 120. In other words, the RLC circuit may include a capacitor C and a resistor R provided by the diodes 110 and 120, and an additional inductor L.

When the optical device 100 operates as the EAM, a reverse voltage is applied to the first diode 110. In other words, the DC bias 135 will provide the reverse voltage. In this case, an electrical field is provided in an intrinsic region of the first diode 110. In addition, there occurs a change in absorption rate, which is one of band gap characteristics of a semiconductor material, by the RF electrical signal provided by the RF signal source 130. According to the change in absorption rate, modulation occurs in externally input light. Here, in order to efficiently modulate the light, a driving point of a modulator may be adjusted by providing a DC voltage bias to the P region of the first diode 110 or the common N region of the first and second diodes 110 and 120. Although not shown in the drawing, the DC voltage bias may be applied together with the RF signal source 130 to the P region of the first diode 110, or implemented in a manner that a bias component is added to the common N region or a substrate region.

When the optical device 100 is driven as the LD, the first diode 110 operates as the LD through forward current injection to the first diode 110. For the LD operation, the DC bias 135 may be added other than the RF signal source 130. For example, the DC bias 135 may be connected to the P region of the first diode 110 so as to provide a forward current bias. Alternatively, the DC bias 135 may be added to the N region of the first diode 110. The RF electrical signal applied to the optical device 100, which operates as the LD or the EAM, may further drive the second diode 120 as a series push-pull structure as well as activating the operation of the LD or modulator. Accordingly, capacitance provided by the first and second diode 110 and 120 connected in series is reduced by half by the RF electrical signal. As the reduction in capacitance, the bit rate of the RF signal may be substantially doubled. However, since the one RF signal source 130 drives the two diodes 110 and 120, substantial voltages over the diodes may be reduced by half.

In the above-described, the schematic circuit structure of the optical device 100 is described according to the embodiment of the inventive concept. For the optical device 100, only the first diode 110 operates as the LD or the EAM, and the second diode 120 only operates as the capacitor for the series push-pull operation. The DC bias 135 is illustrated together with the P region of the first diode 110 or the RF signal source 130, but the embodiment of the inventive concept is not limited thereto. In other words, it may well be understood that the DC bias 135 may be provided or added at any position according to various purposes including performance improvement of the optical device 100.

Figure 2:
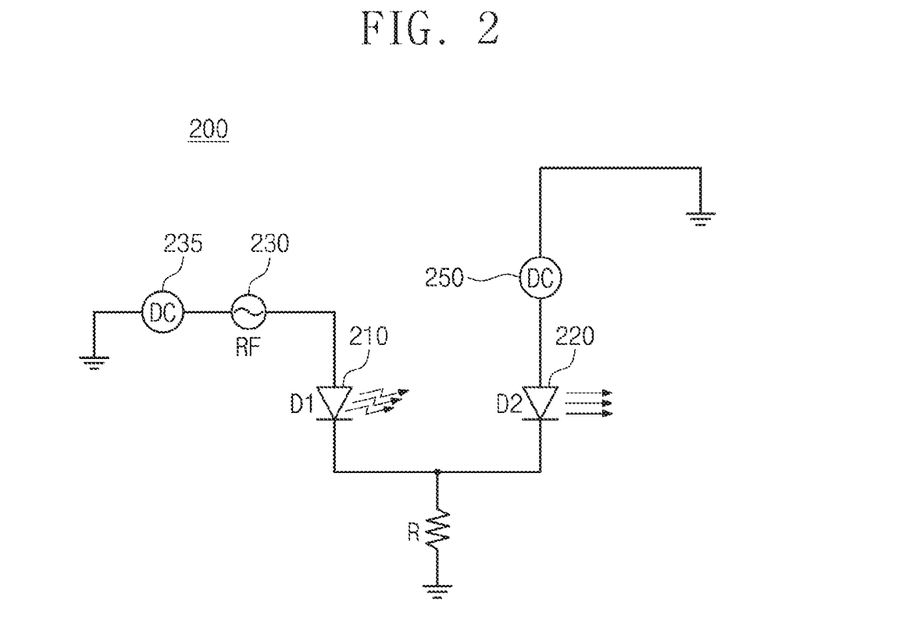
FIG. 2 is a circuit diagram schematically showing an optical device including a series push-pull diode according to another embodiment of the inventive concept.

FIG. 2 is a circuit diagram schematically showing an optical device including a series push-pull diode according to another embodiment of the inventive concept. In relation to FIG. 2, the optical device 200 according to the other embodiment of the inventive concept may include two diodes 210 and 220, an RF signal source 230, DC biases 235 and 250, and a resistor R. Here, the optical device 200 may be provided as an LD or an EAM in which a chirp according to an anti-phase operation to a series push-pull diode is reduced.

The diodes 210 and 220 have a connected structure similar to the diodes 110 and 120 of FIG. 1. However, there is a difference from the optical device 100 of FIG. 1 in that the second diode 220 is biased by the DC bias 250, and light passes through each of the diodes 210 and 220. The first diode 210 and the second diode 220 may be PIN diodes having the same structure. An N region of the first diode 210 and an N region of the second diode 220 may be electrically connected to each other. The resistor R is connected between the ground and the N region of the first diode 210 or the N region of the second diode 220. A P region of the first diode 210 is connected to the RF signal source 230 for inputting an RF electrical signal. The DC bias 235, which is to be serially connected to the RF signal source 230, may be additionally connected to the P region of the first diode 210. In addition, the DC bias 250 may be provided between the ground and the P region of the second diode 220.

In the present embodiment, the light passes through each of waveguides of the diodes 210 and 220. One of the diodes 210 and 220 may operate as the LD or the EAM. Here, it is assumed that the first diode 210 operates as the LD or the EAM. Here, a phase change in contrast to a transient change in optical intensity, which occurs at time of applying the RF electrical signal by the RF signal source 230, is referred to as a chirp. The chirp causes chromatic dispersion in an optical communication. Since the light intensity change due to signal application from the LD or the EAM to an electrode is an inherent phenomenon, the chirp phenomenon may be reduced by decreasing the transient phase change. To this end, the second diode 220 to be used as a capacity, between diodes 210 and 220, uses the anti-phase RF characteristics which occur at the time of a series push-pull operation.

A transient refractive index change caused by the RF electrical signal applied to the first diode 210 changes the phase of the incident light. In addition, the phase change in the light causes a reverse refractive index change in the second diode 220, and a phase change of the second diode 220 also appear in reverse. Accordingly, when the light emitted from the first diode 210 passes through the second diode 220, the phase changes are canceled out and thus the chirp characteristic becomes reduced. For the second diode 220 used as a capacitor diode, when operating in anti-phase with the same intensity as that of the first diode 210, the light emitted from the first diode 210 is strongly absorbed. Accordingly, it is possible to adjust the absorption rate by applying the DC bias 250 to the P region of the second diode 220 to shift an absorption band.

Although not shown in the drawing, in a certain embodiment, in order to apply a bias both the diodes 210 and 220, one DC bias may be provided to the common N region. As the DC bias, both a current bias and voltage bias are possible. When the optical device 200 is driven as an LD, the current bias may be used as the DC bias 235, other than the RF signal source 230. In this case, voltages over the diodes 210 and 220 are determined by the resistor R of the RLC circuit of the N region. When the resistance is large, the voltages over the diodes 210 and 220 become large and thus a high reverse voltage is applied to the capacitor diode. Accordingly, in order to lower the voltages over the diodes 210 and 220, the resistance value of the resistor R may be lowered.

In the above, the schematic circuit structure of the optical device 200 of the embodiment of the inventive concept, which may reduce the chirp, is described. In the optical device 200, the light passes through both the first and second diodes 210 and 220. In addition, only the first diode 210 operates as the LD or the EAM, and the second diode 220 only operates as a capacitor for the series push-pull operation. Waveguide structures in the first diode 210 and the second diode 220 will be described in detail with reference to the drawings.

Figure 3:
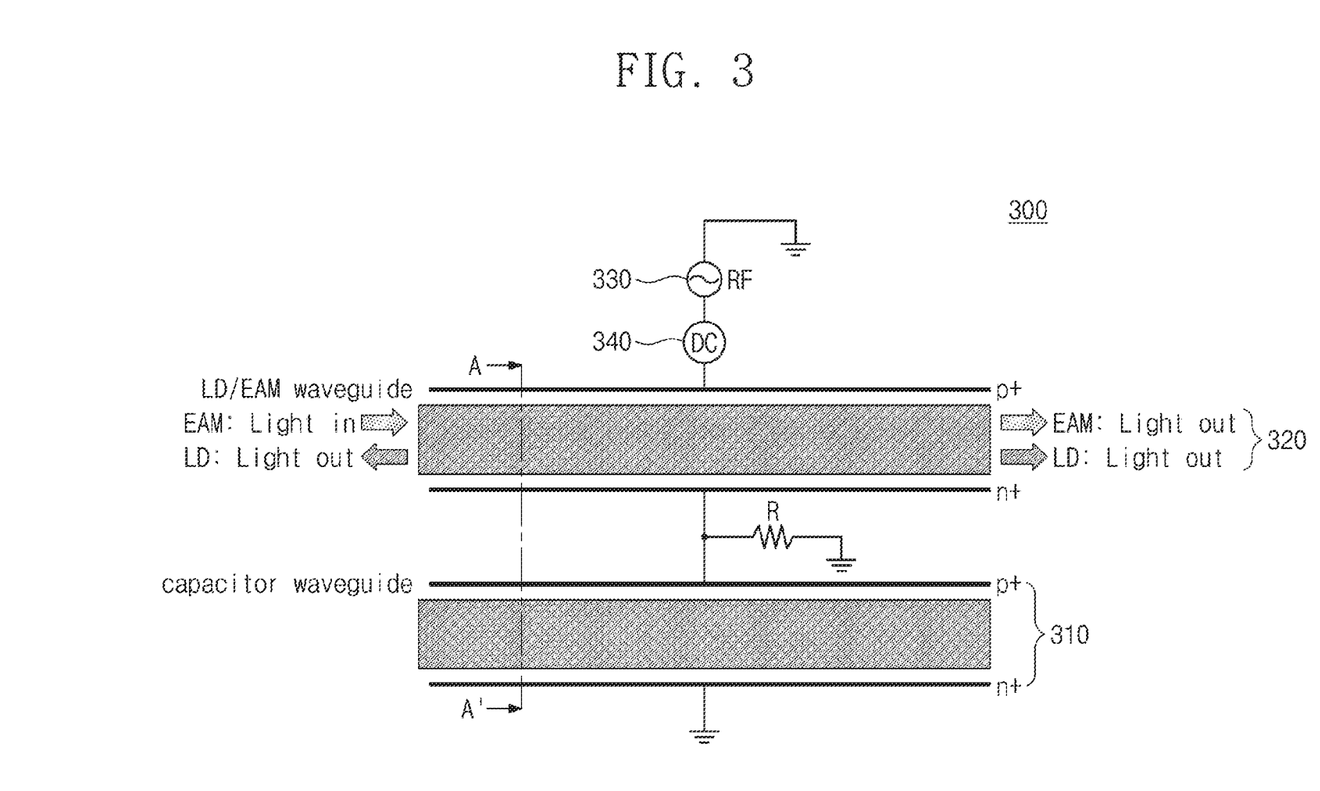
FIG. 3 shows a schematic plan view of the optical device of FIG. 1.

FIG. 3 shows a schematic plan view of the optical device of FIG. 1. In relation to FIG. 3, an optical device 300 viewed from above may include a part of a first diode 310, a second diode 320, an RF signal source 330, a DC bias 340, and a resistor R. The optical device 300 may be driven as an LD or an EAM, and in order to provide the LD, the optical device 300 may have a silicon structure of a III-V group compound semiconductor, or silicon-silicon germanium (Si—SiGe).

The LD is provided in a waveguide type through which the light passes. The waveguide is provided with a core part through which the light is guided, and a cladding part that plays a role of confining the light. In order to provide the LD, on the basis of the waveguide, an upper cladding part of the core may be doped to a P region, and a lower cladding part of the core may be doped to an N region. The core part of the waveguide may be set as an intrinsic region in order to prevent an absorption loss by an impurity used as a dopant. The PIN diode provided in the waveguide basically has a vertical structure, and, according to a purpose, a PIN diode of horizontal structure may be provided through ion implantation or etching.

The diodes 310 and 320 are positioned in parallel. The first diode 310 may receive an RF electrical signal in the P region so as to operate as the LD or EAM. The first diode 310 may be driven by the input RF electrical signal to emit light or absorb light to modulate the light. The P region of the second diode 320 is grounded, is not substantially or directly related to the modulation or generation of light, and only performs a capacitor function of the series push-pull diode structure.

When operating as the LD, the first diode 310 operates as a structure that oscillates internally without incidence of light from the outside. When the optical device 310 operates as the EAM, the first diode 310 externally receives light. For the received light, the intensity becomes changed according to a change in absorption rate caused by the RF electrical signal, and the intensity-changed light is output. The N regions of the diodes 310 and 320 are commonly connected, and the N region in the semiconductor diode may be provided through doping with an N-type impurity. It is illustrated that the resistor R is connected to the N region, but the resistor R may be substantially provided in an RLC circuit.

Figure 4:
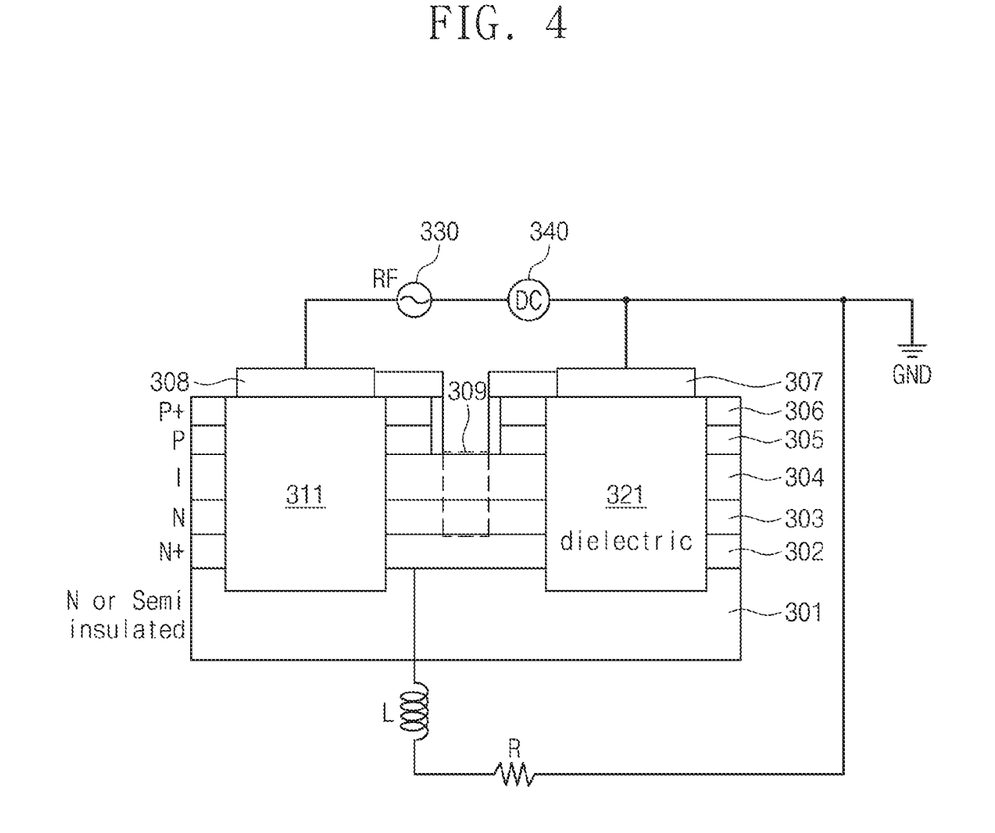
FIG. 4 is cross-sectional view of a cross section cut along line A-A' of FIG. 3.

FIG. 4 is cross-sectional view of a cross section cut along line A-A' of FIG. 3. In relation to FIG. 4, in order to provide the diodes 310 and 320, a plurality of layers 301 to 306 are provided on an N-type or semi-insulated substrate 301 through epitaxy.

First, an N+ layer 302, an N layer 303, an intrinsic layer 304, a P layer 305, and a P+ layer 306 are sequentially provided on the N-type or semi-insulated substrate 301. In addition, after the plurality of layers are provided through the epitaxy, two waveguides 311 and 321 may be provided through etching. Each of the waveguides 311 and 321 is driven with the PIN diode. When removal is performed only to the P region 305 in the etching process, the waveguide is provided in a shallow ridge structure. On the other hand, when the removal is performed to the intrinsic layer 304 and the N layer 303 (removal of part 309) in the etching process, the waveguide may be provided in a deep ridge structure. Even in the deep ridge structure, the N+ layer 302 remains, and the waveguides 311 and 321 exist with the N region connected.

In order to protect the electrical characteristics of the diode and provide an outer part of the waveguides 311 and 321, etching is performed below the N+ layer 302. The etched region may be filled with a dielectric material in order to provide metal electrodes 307 and 308 in a direction of P+ layer 306. For the N layer 303, the N+ layer 302 plays a role of an electrode, and for grounding, the N layer 303 may be grounded through the metal electrodes at a position at which a P type electrode is not disturbed, or may be grounded through the substrate, when the substrate is conductive.

One (e.g. 310) of the diodes 310 and 320 provided through the above-described structure is used as the LD or the EAM. In other words, the light may pass through or generated from the core layer of the waveguide 311 of the first diode 310. On the other hand, the other diode (e.g. 320) just plays a simple capacitor role for the series push-pull operation.

The core region of the first diode 310 through which the light passes is an intrinsic region, and a quantum well (hereinafter, QW), which may emit or absorb light, may be positioned in the region. When a current is applied to the QW, light is emitted and the optical device 300 may operate as a laser. When a voltage is applied to provide an electric field, the absorption coefficient of the QW is adjusted and the optical device 300 may operate as an optical intensity modulator. It may be well understood that the two diodes 310 and 320 may be provided in an identical structure (in terms of the length and width of the wave guide, the doping concentration, the number of quantum wells), each dimension may be changed for improving performance.

Figure 5:
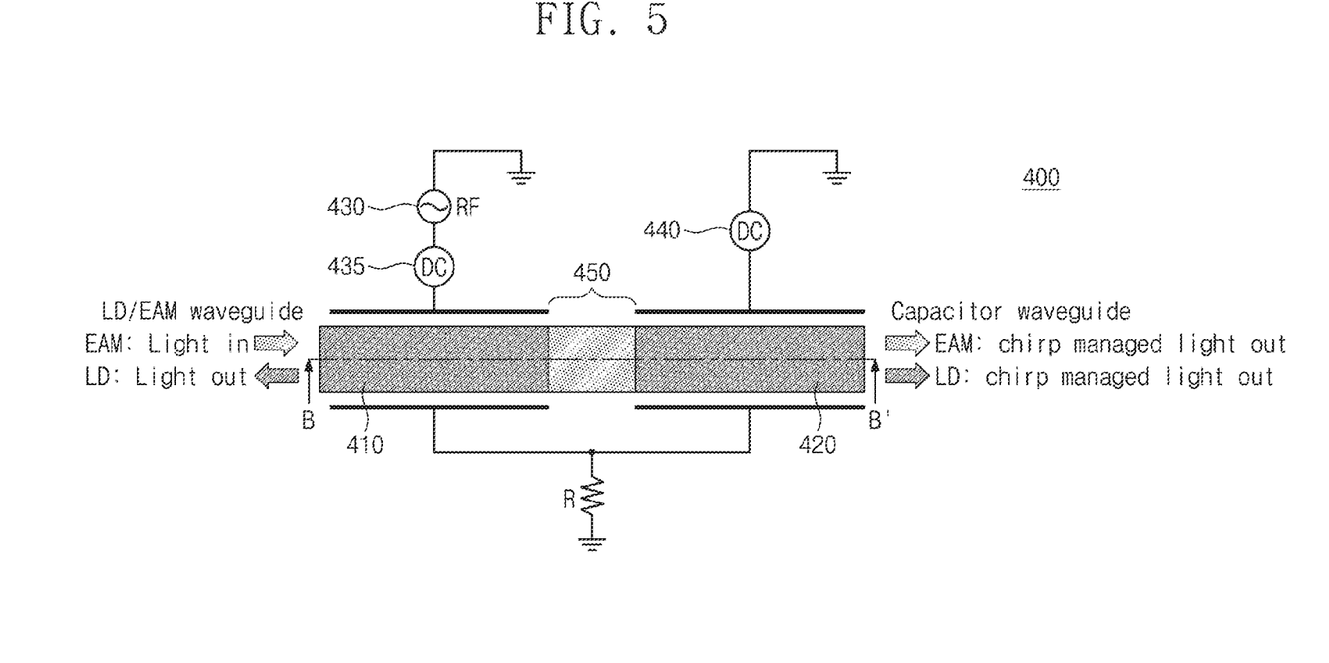
FIG. 5 shows a schematic plan view of the optical device of FIG. 2.

FIG. 5 shows a schematic plan view of the optical device of FIG. 2. In relation to FIG. 5, an optical device 400 viewed from above may include a part of a first diode 410, a second diode 420, an RF signal source 430, DC biases 435 and 440, and a resistor R. The optical device 400 may be driven as an LD or an EAM.

When the optical device 400 is driven as the LD, the first diode 410 oscillates. On the other hand, when the optical device 400 is driven as the EAM, light, which is emitted after the intensity of light that has been externally received is modulated, is incident to the second diode 420, which operates as a capacitor diode, via an intermediate passive waveguide 450. The second diode 420, which operates as a capacitor, operates in anti-phase to the applied RF electrical signal. Accordingly, the second diode 420 accurately operates in anti-phase to a transient phase change occurring in modulation, and plays a role of canceling out the phase change. Accordingly, when the light output from the first diode 410 passes through the waveguide of the second diode 420, a chirp occurring in modulation is reduced.

Figure 6:
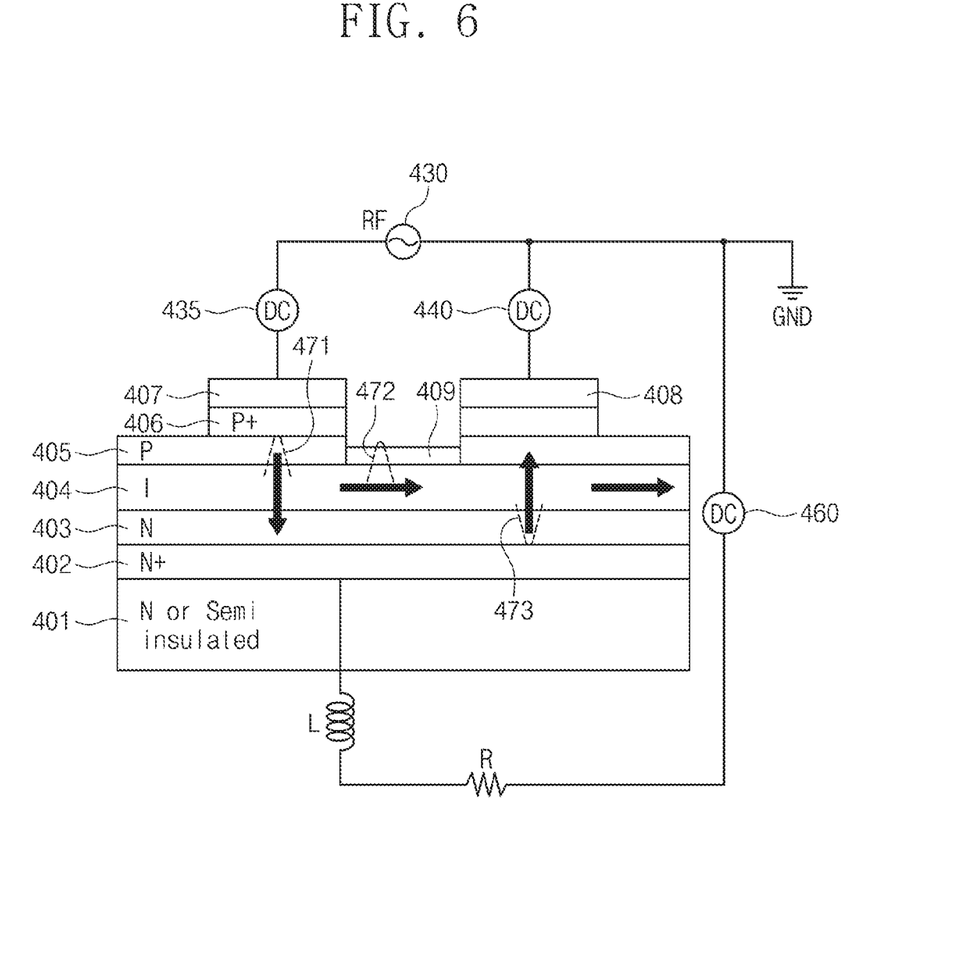
FIG. 6 is cross-sectional view of a cross section cut along line B-B' of FIG. 5.

FIG. 6 is cross-sectional view of a cross section cut along line B-B' of FIG. 5. In relation to FIG. 6, in order to provide the diodes 410 and 420, a plurality of layers 401 to 406 are provided on an N-type or semi-insulated substrate 401 through epitaxy.

First, an N+ layer 402, an N layer 403, an intrinsic layer 404, a P layer 405, and a P+ layer 406 are sequentially provided on the N-type or semi-insulated substrate 401. In addition, after the plurality of layers are provided through the epitaxy, two waveguides (not shown) will be provided through etching. The substantial structure of the optical device 400 is identical to that of FIG. 4, and is different only in a direction of the cross section.

In order to be driven as the LD or EAM, the first diode 410 and the second diode 420, which operates as a capacitor, are connected in a series push-pull structure, and operate in anti-phase. According, the transient phase change 471 occurring in the first diode 410 by the RF signal source 430 is transferred to the intrinsic waveguide (see 472). Since the phase of the light transferred to the second diode 420 via the intrinsic waveguide experiences a reverse phase change 473 inside the second diode 420, the transient phase change may be canceled out. As shown, each of the P layers 405 that provide the two diodes 410 and 420 is connected through the intrinsic layer 404. Accordingly, in order to insulate the P regions of the first and second diodes 410 and 420, the P region between the two diodes 410 and 420 may be etched or doped with impurity to increase the resistance.

As described above, the two diodes 410 and 420 may be provided using an identical structure (in terms of the identical length and width of the waveguide, the doping concentration), and the same number of quantum wells, and may be used with different structures so as to improve efficiency. In addition, not only the DC bias 435 applied to the first diode 410, but a DC bias is also applied to the common N region or the capacitor diode according to the purpose of use.

Through the above-described series push-pull structure, the operation bandwidth of the LD or EAM may be doubled. In addition, the chirp, which occurs through the LD or the EAM, may be reduced with the series push-pull structure according to the embodiment of the inventive concept.

Figure 7:
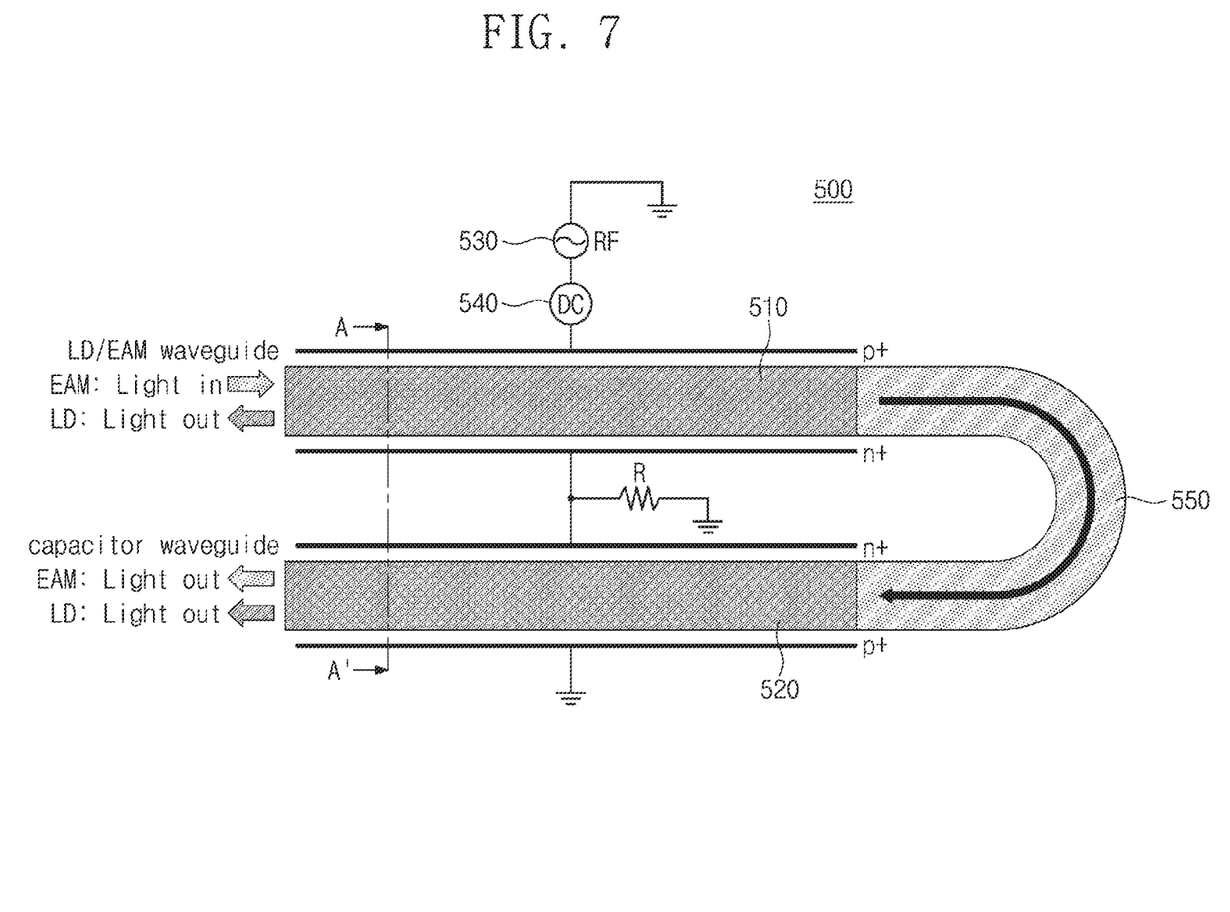
FIG. 7 is a plan view showing a schematic structure of an optical device according to another embodiment of the inventive concept.

FIG. 7 is a plan view showing a schematic structure of an optical device according to another embodiment of the inventive concept. In relation to FIG. 7, an optical device 500 may include a first diode 510, a second diode 520 provided at a position parallel to the first diode 510, an RF signal source 530, a DC bias 540, a curved waveguide 550 and a resistor R. The optical device 500 may be driven as an LD or an EAM.

When the optical device 500 operates as the LD (an LD mode), light is generated by oscillation of the first diode 510. The light generated in the first diode 510 may be output along the waveguide. When the optical device 500 is driven as the EAM (an EAM mode), the intensity of externally input light is modulated by an RF electrical signal provided by the RF signal source 530, and the intensity-modulated light is output. The light generated and modulated in the first diode 510 is output along the curved waveguide 550, and then the light, of which direction is changed, is incident to the second diode 520. In this case, the second diode 520, which operates as a capacitor, operates in anti-phase to the applied RF electrical signal. Accordingly, the second diode 520 accurately operates in anti-phase to a transient phase change occurring in modulation to play a role of canceling out the phase change. Accordingly, when the light output from the first diode 510 passes the waveguide of the second diode 520, the chirp occurring in modulation is canceled out or reduced.

Here, the curved waveguide 550 for changing the direction of the light output from the first diode 510 may be replaced with or implemented with various components. For example, at least one of the following components may be used for replacement: a ring resonator, a directional coupler, a contra-directional coupler, a multi-mode interferometer, a mirror reflector, a Bragg grating reflector, a Reflective Semiconductor Optical Amplifier (RSOA), or the like.

According to the embodiments of the inventive concept, the bit rate of a laser diode or an electro-absorption modulator may be doubled. In addition, a chirp may be reduced in the laser diode or the electro-absorption modulator.

While the present disclosure has been described with reference to exemplary embodiments thereof, it will be clear to those of ordinary skill in the art to which the disclosure pertains that various modifications may be made to the described embodiments without departing from the spirit and scope of the present disclosure. Therefore, the scope of the present disclosure is not limited to the described embodiments but is defined by the claims and their equivalents.

What is claimed is:

1. An optical device comprising:
   a radio frequency (RF) signal source configured to provide an RF signal electrically;
   a first diode configured to operate as a laser diode (LD) or an electro-absorption modulator (EAM) in response to the RF signal;
   a second diode configured to share an N region of the first diode, be serially connected to the first diode, and have a P region connected to a ground to operate as a capacitor for series push-pull operation with the first diode; and
   a resistor connected between the first diode and the second diode, and the ground.

2. The optical device of claim 1, wherein when the first diode operates as the LD, the RF signal is provided as a current signal.

3. The optical device of claim 2, further comprising:
   a direct current (DC) current bias connected to at least one of the P region and the N region of the first diode.

4. The optical device of claim 1, wherein when the first diode operates as the EAM, the RF signal is provided as a voltage signal.

5. The optical device of claim 4, further comprising:
   a DC voltage bias applied to at least one of the P region and the N region of the first diode, and substrate regions of the first and second diodes.

6. The optical device of claim 1, wherein the first diode comprises a first waveguide activated by the RF signal, and the second diode comprises a second waveguide having an identical structure to the first diode.

7. The optical device of claim 6, wherein the first waveguide and the second waveguide are optically separated, and incidence of light which is output from the first waveguide to the second waveguide is prevented.

8. The optical device of claim 6, wherein the first waveguide and the second waveguide are optically connected, and light which is output from the first waveguide is incident to the second waveguide.

9. The optical device of claim 8, wherein the first waveguide and the second waveguide are provided in parallel, and a curved waveguide is further comprised so as to transfer the light, which is output from the first waveguide, to the second waveguide.

10. The optical device of claim 8, wherein the first waveguide and the second waveguide are provided in parallel, and at least one of following components is further comprised to transfer the light, which is output from the first waveguide, to the second waveguide, the components comprising: a ring resonator, a directional coupler, a contra-directional coupler, a multi-mode interferometer, a mirror reflector, a Bragg grating reflector, and a reflective semiconductor optical amplifier RS OA.

11. The optical device of claim 6, wherein a waveguide length, a waveguide width, a waveguide height, a doping concentration, and a number of quantum wells of the first waveguide are the same as a waveguide width, a waveguide height, a doping concentration, and a number of quantum wells of the second waveguide.

12. The optical device of claim 6, wherein each of the first waveguide and the second waveguide is provided in a ridge structure.

13. The optical device of claim 1, further comprising:
an inductor connected to the resistor and the ground.

* * * * *